(12) United States Patent  (10) Patent No.: US 8,158,478 B2
Yan et al.  (45) Date of Patent: Apr. 17, 2012

(54) STRAINED SEMICONDUCTOR DEVICE AND METHOD OF MAKING SAME

(75) Inventors: Jiang Yan, Newburgh, NY (US); Danny Pak-Chum Shum, Poughkeepsie, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 12/642,472

(22) Filed: Dec. 18, 2009

(65) Prior Publication Data

US 2010/0096685 A1   Apr. 22, 2010

Related U.S. Application Data

(62) Division of application No. 11/546,662, filed on Oct. 12, 2006, now Pat. No. 7,651,915.

(51) Int. Cl.
*H01L 21/8247* (2006.01)
(52) U.S. Cl. .................................. 438/257; 257/E21.179
(58) Field of Classification Search .......... 438/257–267; 257/E21.179
See application file for complete search history.

(56) References Cited

U.S. PATENT DOCUMENTS

| 4,151,021 | A | 4/1979 | McElroy | |
|---|---|---|---|---|
| 4,495,693 | A | 1/1985 | Iwahashi et al. | |
| 5,110,753 | A | 5/1992 | Gill et al. | |
| 5,210,047 | A | 5/1993 | Woo et al. | |
| 5,340,760 | A | 8/1994 | Komori et al. | |
| 6,103,572 | A * | 8/2000 | Kirihara | 438/257 |
| 6,187,632 | B1 * | 2/2001 | Shuto et al. | 438/257 |
| 6,335,289 | B1 * | 1/2002 | Kikuchi | 438/702 |
| 6,582,998 | B2 * | 6/2003 | Nitta | 438/217 |
| 7,053,400 | B2 | 5/2006 | Sun et al. | |
| 7,064,382 | B2 | 6/2006 | Kodama et al. | |
| 7,303,955 | B2 | 12/2007 | Kim | |
| 7,452,773 | B2 * | 11/2008 | Kwon et al. | 438/257 |
| 2007/0096193 | A1 | 5/2007 | Forbes et al. | |

OTHER PUBLICATIONS

Arghavani, R., et al., "Strain Engineering in Non-Volatile Memories," Semiconductor International, http://www.semiconductor.net, Apr. 1, 2006, 5 pages.

* cited by examiner

*Primary Examiner* — Richard A. Booth
(74) *Attorney, Agent, or Firm* — Slater & Matsil, L.L.P.

(57) ABSTRACT

In a method of making a semiconductor device, a gate dielectric is formed over the semiconductor body. A floating gate is formed over the gate dielectric, an insulating region over the floating gate, and a control gate over the insulating region. The gate dielectric, floating gate, insulating region, and control gate constitute a gate stack. A stress is caused in the gate stack, whereby the band gap of the gate dielectric is changed by the stress.

11 Claims, 7 Drawing Sheets

STRAINED SEMICONDUCTOR DEVICE AND METHOD OF MAKING SAME

This application is a divisional of U.S. patent application Ser. No. 11/546,662, entitled "Strained Semiconductor Device and Method of Making Same," filed on Oct. 12, 2006 now U.S. Pat. No. 7,651,915, which application is incorporated herein by reference.

TECHNICAL FIELD

This invention relates generally to semiconductor devices and methods, and more particularly to devices and methods for modulating stress in transistors in order to improve performance.

BACKGROUND

Semiconductor devices are used in a large number of electronic devices, such as computers, cell phones and others. One of the goals of the semiconductor industry is to continue shrinking the size and increasing the speed of individual devices. Smaller devices can operate at higher speeds since the physical gate length is smaller and follows the universal scaling law. In addition, higher conductivity materials, such as copper, are replacing lower conductivity materials, such as aluminum. As the geometries of semiconductor devices shrink and their performance improves, however, the maintaining low leakage current becomes a challenge.

One type of semiconductor device is a memory device, in which data is typically stored as a logical "1" or "0." Memory devices may be static or dynamic. Dynamic memory devices need to be refreshed to "remember" the data, whereas static memory devices do not need to be refreshed to retain stored data.

One type of static memory device, also referred to in the art as a non-volatile memory (NVM) device, is a flash memory device. A flash memory device is an electrically erasable programmable read only memory (EEPROM) that is commonly used in computers, digital cameras, MP3 players, gaming systems, and memory sticks, as examples, although flash memory devices may be used in other applications, as well. Flash memory devices do not require power to retain stored data; they retain data even when the power source is disconnected. In flash memory devices, in-circuit wiring is used to erase predetermined sections or blocks of the chip by applying an electrical field to the entire chip, for example.

Flash memory devices typically comprise an array of flash memory cells. Flash memory cells are accessible for programming and retrieving data by an array of wordlines and bitlines coupled to the array of flash memory cells. Each flash memory cell comprises a floating gate and a control gate, which are separated by a thin insulator. Flash memory cells are programmed by applying a voltage to the control gate. Flash memory cells store a charge in the floating gate and are programmed using Fowler-Nordheim tunneling or channel hot electron injection from the channel or source and drain regions.

Recent flash memory applications include "embedded flash memory" and system on a chip (SoC) devices, in which an array of flash memory cells and peripheral circuitry for the flash memory cells are formed together with the microcontroller or processor on a single chip or integrated circuit. The peripheral circuitry may comprise high voltage circuits, for column/row decoders or drivers, charge pumps, transfer gates or other logic circuits for microcontrollers or processors, and other types of devices that may comprise transistors, diodes, bandgap devices, capacitors, inductors, and linear devices, as examples, although other types of devices may be included in the peripheral circuitry.

In the field of non-volatile memories (NVM), it is very desirable to shrink the size of the NVM cell so that either more memory can be stored in a given area to achieve higher density, or a given amount of memory takes up less silicon area to achieve more die per wafer to further reduce costs. Scaling down the size of the NVM cell requires reducing the length of the gate. This is typically achieved by thinning the tunnel oxide to control the short channel effect. A thinner tunnel oxide, however, leads to increased leakage current and loss of the stored charge on the floating gate. This negatively impacts the charge retention lifetime and the device reliability. What is needed is a method to prevent leakage current in NVMs while allowing for a reduced NVM cell size to take advantage of shrinking geometries.

SUMMARY OF THE INVENTION

In a method of making a semiconductor device, a gate dielectric is formed over the semiconductor body. A floating gate is formed over the gate dielectric, an insulating region over the floating gate, and a control gate over the insulating region. The gate dielectric, floating gate, insulating region, and control gate constitute a gate stack. A stress to the gate is caused in the gate dielectric, whereby an energy gap of the gate dielectric is changed by the stress.

The foregoing has outlined rather broadly features of the present invention. Additional features of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Figure 1A:
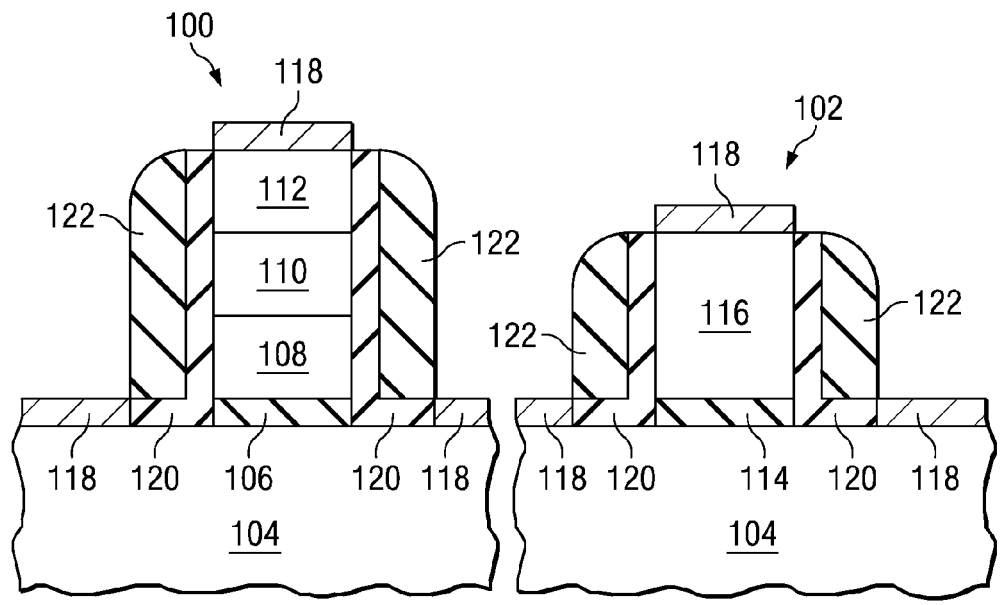
FIGS. 1a-1e provide cross-sectional views and a flowchart of a first embodiment process.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of preferred embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

The invention will now be described with respect to preferred embodiments in a specific context, namely a method for reducing leakage current in a floating gate NVM device. Concepts of the invention can also be applied, however, to other electronic devices. For example, other classes of non-volatile memories, such as single poly charge trapping devices, devices which replace the floating polysilicon gate by ONO or high K dielectrics, SONOS, MONOS, and NROM. Other devices, such as volatile memories, transistors and other logic devices, can also utilize concepts of the invention.

Strained silicon can be used to improve the mobility of the channel of an MOS device. Various aspects of the present invention utilize strain in a transistor device, such as a floating gate transistor, to increase the energy gap of the gate dielectric. A device with a high energy gap is prone to less leakage. It has been discovered that in standard fine geometry devices, stress does not have a large impact on the energy gap because of the difficulty of introducing stress into a very thin oxide. In NVM devices, where the tunnel oxide is thicker, the introduction of stress to the gate has a more significant impact on the energy gap. Introducing stress in the gate of an NVM device is challenging, however, because of the difficulty of delivering enough stress to the gate area in order to adequately improve performance.

Various methods for the formation of transistor devices using these concepts will be described with respect to FIGS. 1a-1e, FIGS. 2a-2d, and FIGS. 3a-3d.

In the first embodiment of the present invention, stress is introduced into the gate area by depositing a stress liner over a partially formed transistor. In order to increase the level of stress in the transistor, however, one of the spacers in the process is removed prior to the deposition of the stress liner.

FIGS. 1a-1d illustrate cross-sectional views of various steps in implementing the first embodiment. FIG. 1e provides a flow diagram that describes the fabrication steps for the first embodiment. The steps denoted with a "*" in FIG. 1e are steps which are used for the fabrication of NVM and high voltage devices. The remaining steps are used for low voltage devices or are common to all devices in the process.

Figure 1B:
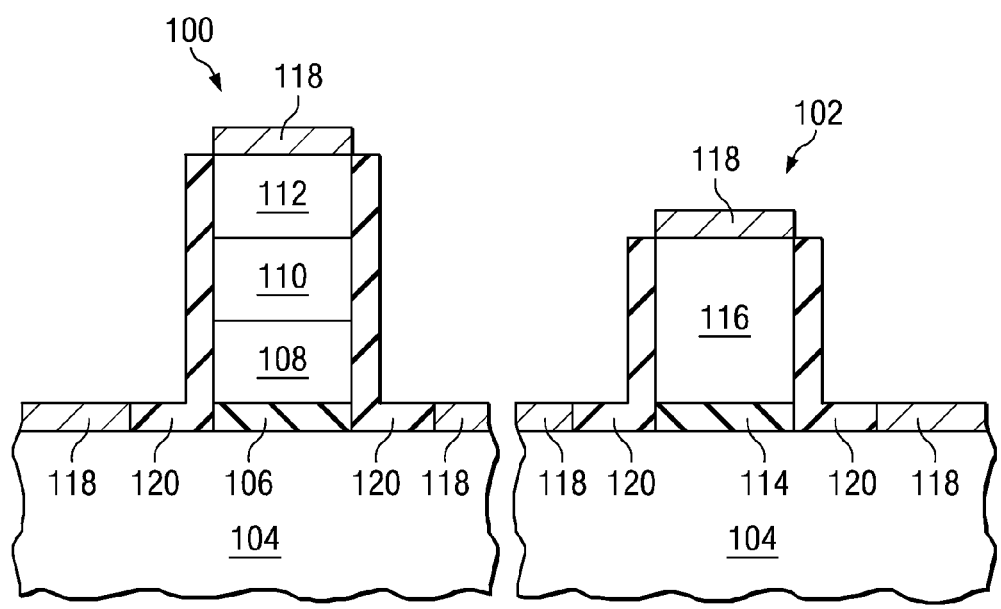
Figure 1C:
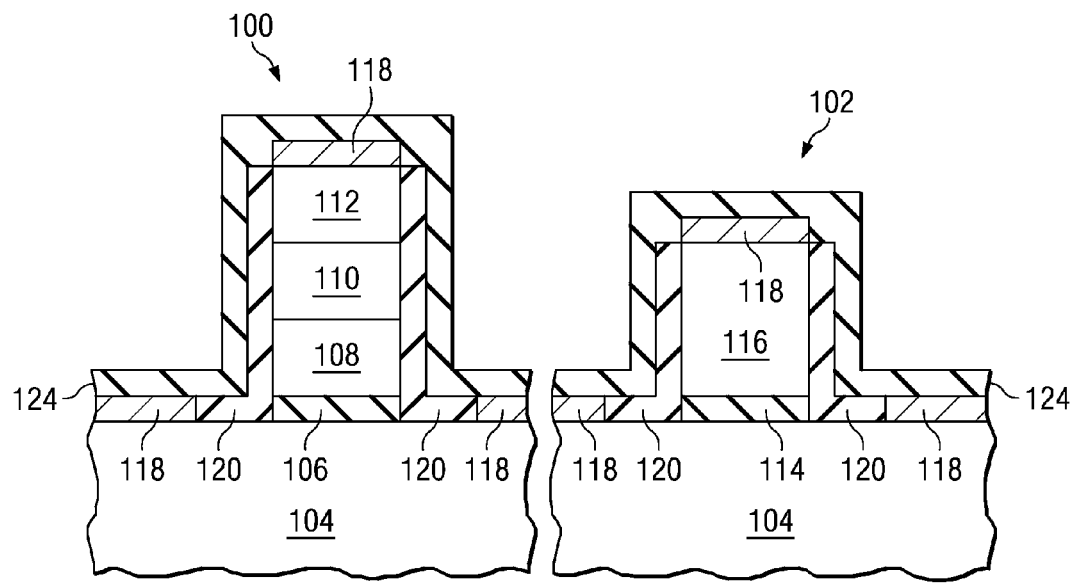
Figure 1D:
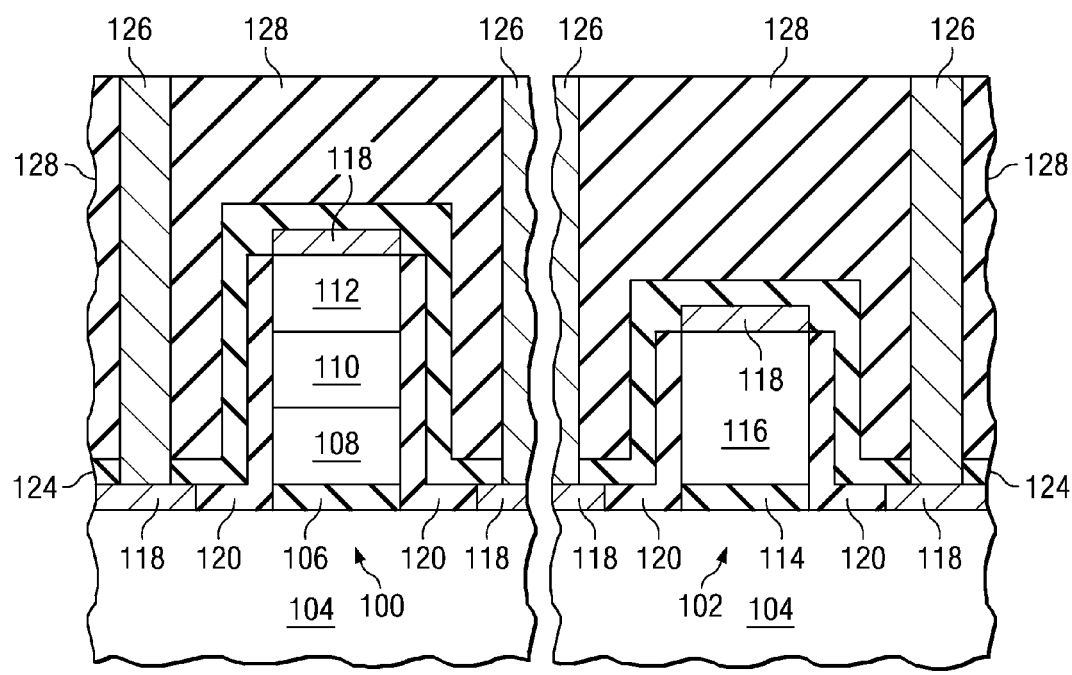
Figure 1E:
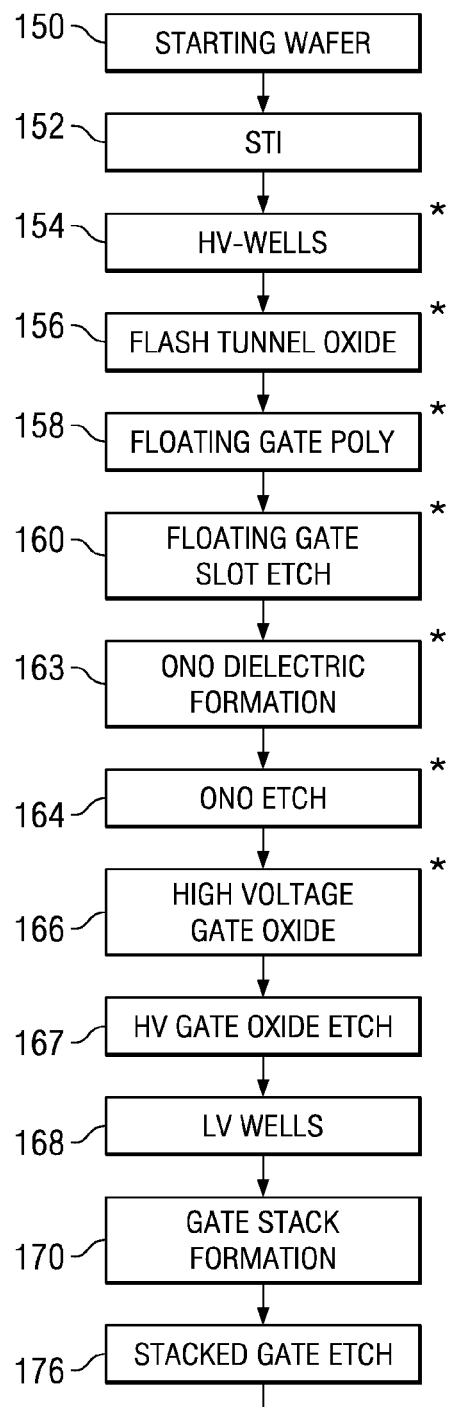
Figure 1E:
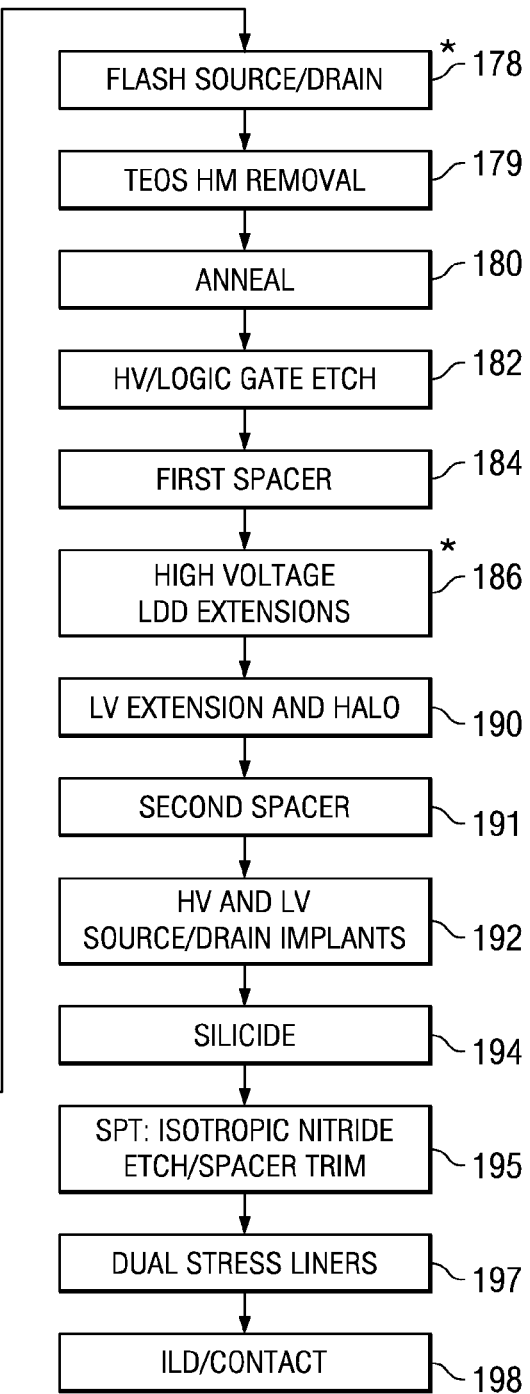

An initial structure, which is produced from steps 150 to 194 in FIG. 1e, is shown in FIG. 1a. A semiconductor body 104 is shown, on top of which two devices, an NVM device 100 and a standard MOS device 102 (e.g., an NMOS or PMOS transistor), are fabricated. For the NVM device, a tunnel oxide layer 106, a floating gate 108, an insulating layer 110, a control gate 112, and a silicide layer 118 are formed over the semiconductor body 104. For the standard device 102, a gate dielectric layer 114, a gate electrode 116, and a silicide layer 118 are formed over the semiconductor body 104. A first spacer 120 is formed at the sidewalls and extension area of the NVM device and on the sidewalls and extension areas of the standard device. A second spacer 122 is formed on the first spacer. Layers 112 and 116 typically share the same gate materials.

Looking to the process flow shown in FIG. 1e, in a preferred embodiment CMOS NVM process a starting wafer is provided (block 150) and shallow trench isolation regions (STI) are formed in the semiconductor body (block 152). First, isolation trenches can be formed using conventional techniques. For example, a hard mask layer, such as silicon nitride, can be formed over the semiconductor body and patterned to expose the isolation areas. The exposed portions of the semiconductor body can then be etched to the appropriate depth.

The trenches are then filled with an isolating material. For example, exposed silicon surfaces can be thermally oxidized to form a thin oxide layer. The trenches can then be lined with a first material such as a nitride layer (e.g., $Si_3N_4$). The trenches can then be filled with a second material, such as an oxide. For example, a high density plasma (HDP) can be performed, with the resulting fill material being referred to as HDP oxide. In other embodiments, other trench filling processes can be used.

In step 154, the HV triple wells are formed using conventional techniques. In the present embodiment process, n-wells are created for the PMOS devices, p-wells are created for the NMOS devices, and triple wells are formed for the NMOS NVM devices. In other embodiments, modified triple wells could be used for the logic transistors and/or the NVM devices could be formed in a single (or double well) in which PMOS NVM are formed on n-wells over N-substrate.

The flash memory tunnel oxide is formed in step 156 using high temperature thermal process. In the first embodiment of the present invention, the tunnel oxide layer 106 preferably comprises an oxide, such as silicon dioxide or SiON, although the thin tunnel oxide 106 may alternatively comprise high k dielectric materials, such as $Al_2O_3$ or HfSiON, combinations or multiple layers thereof, or combinations or multiple layers thereof with silicon dioxide, as examples, although other materials may also be used. The tunnel oxide layer 106 preferably comprises a thickness of about 10 nm or less as an example, although the tunnel oxide layer 106 may alternatively comprise other thicknesses.

In step 158, the floating gate is formed. In the preferred embodiment of the present invention, the floating gate 108 preferably comprises about 150 nm or less of polysilicon that is in-situ low doped, e.g., with n-type dopants, for an n-channel flash memory device. Alternatively, the floating gate 108 may comprise other materials and/or may be in-situ low doped with p-type dopants, for example, for a p-channel flash memory device, and the floating gate 108 may comprise other thicknesses. The polysilicon is deposited using LPCVD in a furnace while being exposed to phosphine gas for n-type doping. The floating gate polysilicon is typically doped to a concentration of between $5 \times 10^{18}$ $cm^{-3}$ and $1 \times 10^{20}$ $cm^{-3}$. Alternatively, floating gate 108 may comprise an ONO or high K dielectric such as HfSiO2, HfSiON, $Al_2O_3$, or other materials as in single poly charge trapping devices.

A floating gate slot etch which serves to define columns of NVM device parallel to bitline direction, is performed in step 160 using photo resist and a reactive ion etch (RIE). In the preferred embodiment, the floating gate 108 is etched using a dry etch. In some embodiments, the tunnel oxide is also etched, but care must be taken not to damage the oxide through plasma etch or create a recess in the surrounding semiconductor body 104.

In step 163, the NVM device's insulating dielectric 110 is formed over the floating gate 108 and preferably comprises a tri-layer of oxide/nitride/oxide (ONO). Alternatively, the insulating layer 110 may comprise a high k dielectric material such as $HfSiO_2$, HfSiON, $Al_2O_3$, or other materials. In one embodiment, the insulating layer 110 may comprise a first layer comprising a low temperature polysilicon oxide, a second layer comprising a low pressure chemical vapor deposition (LPCVD) nitride disposed over the first layer, and a third layer comprising a high temperature oxide disposed over the second layer. For example, the first layer may be formed by thermal oxidation of the semiconductor device 100 to about 900° C., and exposing the floating gate 108 to oxygen; the second layer may be formed by depositing silicon nitride using LPCVD, and the third layer may be formed by heating the semiconductor device 100 in the presence of steam to oxidize the second layer at a temperature of about 900° C., and/or depositing oxide or re-oxidizing the second layer of nitride to form silicon dioxide. The insulating dielectric 110 preferably comprises an equivalent oxide thickness of about 20 nm to about 12 nm.

The ONO is patterned and etched in using photoresist in step 164. In a preferred embodiment, the ONO is also etched away from all non-NVM devices, such as the high voltage and standard logic devices.

The preferred embodiment includes high voltage devices, e.g., charge pumps or decoders or drivers as well as transfer gate transistors that must withstand higher voltages. In step 166, the high voltage gate oxide is formed, e.g., by thermal oxidation, patterned and etched in using photoresist in step 167. In step 168, the LV wells are formed using conventional techniques.

In step 170, the control gate 112 is formed by a dedicated NVM gate mask. A gate dielectric layer 114 (also deposited on top of dielectric layer 110) is formed over a portion of a semiconductor body 104. In one embodiment, the gate dielectric 114 comprises a thermally grown RTO oxide (e.g., $SiO_2$), or combination of oxide and nitride (e.g., SiON, oxynitrided-oxide sequence). In other embodiments, a high-k dielectric material having a dielectric constant of about 5.0 or greater is used as the gate dielectric 114. Suitable high-k materials include $HfO_2$, $HfSiO_x$, $Al_2O_3$, $ZrO_2$, $ZrSiO_x$, $Ta_2O_5$, $La_2O_3$, nitrides thereof, $HfAlO_x$, $HfAlO_xN_{1-x-y}$, $ZrAlO_x$, $ZrAlO_xN_y$, $SiAlO_x$, $SiAlO_xN_{1-x-y}$, $HfSiAlO_x$, $HfSiAlO_xN_y$, $ZrSiAlO_x$, $ZrSiAlO_xN_y$, combinations thereof, or combinations thereof with $SiO_2$, as examples. Alternatively, the gate dielectric 114 can comprise other high-k insulating materials or other dielectric materials. As implied above, the gate dielectric 114 may comprise a single layer of material, or alternatively, the gate dielectric 114 may comprise two or more layers.

The gate dielectric 114 may be deposited by chemical vapor deposition (CVD), atomic layer deposition (ALD), metal organic chemical vapor deposition (MOCVD), or jet vapor deposition (JVD), as examples. In other embodiments, the gate dielectric 114 may be deposited using other suitable deposition techniques. The gate dielectric 114 preferably comprises a thickness of about 8-16 Å to about 60 Å in one embodiment, although alternatively, the gate dielectric 114 may comprise other dimensions.

A gate electrode layer 112/116 is formed over the gate dielectric layer 110/114. The gate electrode layer preferably comprises a semiconductor material, such as polysilicon or amorphous silicon, although alternatively, other semiconductor materials may be used for the gate electrode layer 112/116. In other embodiments, the gate electrode layer 112/116 may comprise TiN, HfN, TaN, W, Al, Ru, RuTa, TaSiN, $NiSi_x$, $CoSi_x$, $TiSi_x$, Ir, Y, Pt, Ti, PtTi, Pd, Re, Rh, borides, phosphides, or antimonides of Ti, Hf, Zr, TiAlN, Mo, MoN, ZrSiN, ZrN, HfN, HfSiN, WN, Ni, Pr, VN, TiW, and/or combinations thereof, as examples.

In preferred embodiments, the NVM gate stack is patterned and etched using a hard mask technique with the dedicated NVM gate mask, although in other embodiments resist soft mask or other masking materials can be used. This patterning is shown in step 172, wherein tetraethyloxysilane (TEOS) gas is used as a precursor gas to form an anti-reflective coating layer of $SiO_2$ on the wafer. In other embodiments, the hard mask layer could consist of other materials such as $Si_xN_y$, for example.

The NVM gate stacks are etched in step 176. In some embodiments, the layer of photoresist is patterned using the lithography mask, and then the layer photoresist is used to pattern the hard mask. The layer of photoresist may then be removed, and the hard mask is used to pattern the material layer, for example. Or, alternatively, both the layer of photoresist and the hard mask are used to pattern the material layer. In preferred embodiments, the hard mask may be left remaining, or it may be removed. In the preferred embodiment the NVM gate stack is etched using an RIE.

In step 178, the NVM source/drain is doped. In a preferred embodiment, doping is done though an ion implant process where arsenic or phosphorus ions are implanted. In the preferred embodiment, the NVM devices are n-channel devices, so the source/drain will be implanted with an n-type material. In other embodiments, where a p-channel NVM is formed, the source/drain regions are doped with p-type material such as boron. In one embodiment, phosphorus ions can be implanted with a dose of about $5\times10^{13}$ $cm^{-2}$ to about $5\times10^{14}$ $cm^{-2}$ and an implant energy between about 20 keV and about 80 keV. In step 179, the TEOS Hard Mask is removed.

In step 180, the NVM device source/drain is then annealed to repair any implantation damage. In a preferred embodiment, a high temperature anneal is performed for about 30 minutes at a temperature of about 900° C., forming about 15 nm sidewall oxidation.

In step 182, the gates of the standard logic are patterned and etched using standard techniques. Either a hard mask or a soft mask can be used. In a preferred embodiment of the present invention, photoresist and an RIE are used to etch the standard logic gates.

Because of damage to the standard logic device's polysilicon gates, first spacers 120 are formed in step 184, which includes a re-oxidation step to encapsulate the polysilicon gate and a low temperature oxide (LTO) is deposited on the sidewalls of the gate stack LV, HV and over the extension areas of the NVM device. In a preferred embodiment, a furnace thermal oxidation (e.g., 900° C., 10 min.) is used to accomplish this, although the first spacers 120 may alternatively comprise a nitride.

In step 186, the LDD extension regions for the high voltage devices are implanted using HV masks. In step 190 the LV extension and halo regions are formed for the standard logic devices.

Second spacers 122 are formed over the first spacers 120 in step 191. In a preferred embodiment, the second spacers typically comprise a nitride such as silicon nitride. Alternatively the second spacers may be made from an oxide.

The source/drain regions of the standard devices 102, HV as well as the NVM 100 devices are implanted in step 192. If a p-type transistor is to be formed, a p-type ion implant is used to form the heavily doped source and drain regions. For example, boron ions can be implanted with a dose of about $5\times10^{14}$ $cm^{-2}$ to about $5\times10^{15}$ $cm^{-2}$ and an implant energy between about 10 keV and about 50 keV. In other embodiments, other materials, such as $BF_2$ or In, can be implanted. If an n-type transistor is to be formed, an n-type ion implant is used to form the heavily doped source and drain regions. In the preferred embodiment, arsenic or phosphorus ions are implanted into the source/drain regions. For example, arsenic ions can be implanted with a dose of about $5\times10^{14}$ $cm^{-2}$ to about $5\times10^{15}$ $cm^{-2}$ and an implant energy between about 30 keV and about 80 keV. In other embodiments, other materials, such as Sb, can be implanted.

Silicide regions 118 are formed over the control gate 112 and over source/drain contact areas to form low resistivity upper surface regions in step 194. Silicide is formed by first depositing a silicidation metal over the semiconductor body 104, the control gate 112, and over the gate electrode 116, then subjecting the structure to an annealing process. In the preferred embodiment, the silicidation metal is nickel, but the metal could also be cobalt, copper, molybdenum, titanium, tantalum, tungsten, erbium, zirconium, platinum, or combinations thereof. In one example, the semiconductor body 104 is then heated to about 400° C. or 500° C. to form a single layer of nickel silicide.

In the first embodiment of the present invention, as shown in FIG. 1b, and as described in the process flow chart of FIG. 1e, a stress proximity technique (SPT) is used to increase the stress impact to the gate dielectric from the contact nitride liner in order to reduce tunneling leakage. Second spacer 122, is removed from devices 100 and 102 in step 195. In the first embodiment of the present invention, removal is achieved by an isotropic RIE, although other methods, such as a wet etch, may alternatively be used.

Turning to FIG. 1c, a stress inducing liner 124 is deposited over devices 100 and 102. In one embodiment, dual stress liners (DSL) are used, as indicated by step 197. The stress liner 124 is typically formed by deposition of a nitride layer with a tensile or compressive stress. For example, a nitride film (e.g., silicon nitride) can be deposited in such a way as to create a stress between the stress liner 124 and the underlying gate stack. For a silicon nitride liner, typically the Si—N to Si—H bonding influences the stress direction—the lower Si—H to Si—N ratio, the more tensile. As is known in the art, deposition rate, pressure, UV curing, and other factors dictate this ratio.

The applied stress-inducing liners are tensile for the n-channel transistor devices 102 and compressive for p-channel transistor devices 102 (either standard or high voltage devices). Alternatively in other embodiments, only a tensile liner may be formed on the n-channel devices with no liner being formed on the p-channel devices, or only a compressive liner may be formed on the p-channel devices and no liner is formed on the standard and high voltage n-channel devices.

The NVM device 100 also receives stress from the stress liner. In the preferred embodiment, this stress will change the band gap of the gate stack 106. For an n-channel NVM (i.e., where the source/drain regions are n-doped), a tensile strained liner 124 is preferably used.

Referring now to FIG. 1d, the additional processing sequence of step 198 is illustrated. An interlayer dielectric (ILD) layer 128 is formed over the stress liner 124 which serves as an etch stop layer. Suitable ILD layers include materials such as SACVD oxide, plasma enhanced tetraethyloxysilane (TEOS), doped glass (BPSG, PSG, BSG), organo silicate glass (OSG), fluorinated silicate glass (FSG), and spin-on-glass (SOG), as examples. Typically, the gate electrode (not shown) and source/drain contacts 126 are formed through the interlayer dielectric. Metallization layers that interconnect the various components are also included in the chip, but not illustrated for the purpose of simplicity.

Figure 2A:
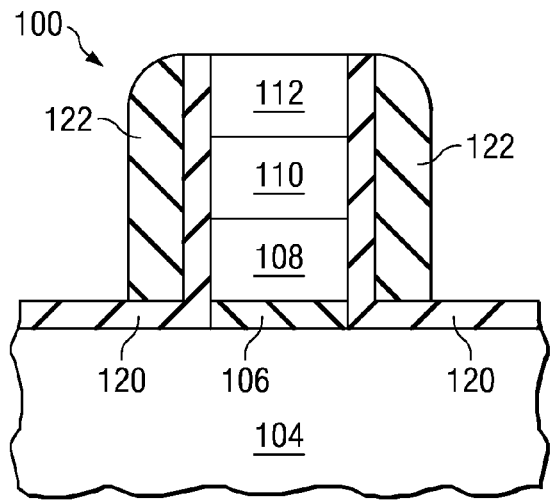
FIGS. 2a-2d provide cross-sectional views and a flowchart of a second embodiment process.
Figure 2B:
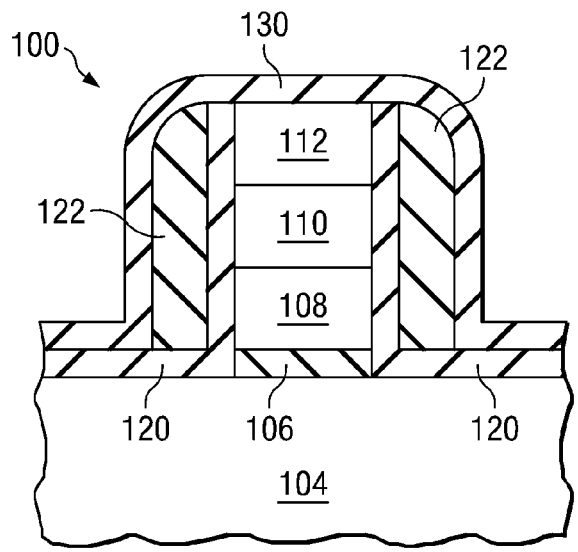
Figure 2C:
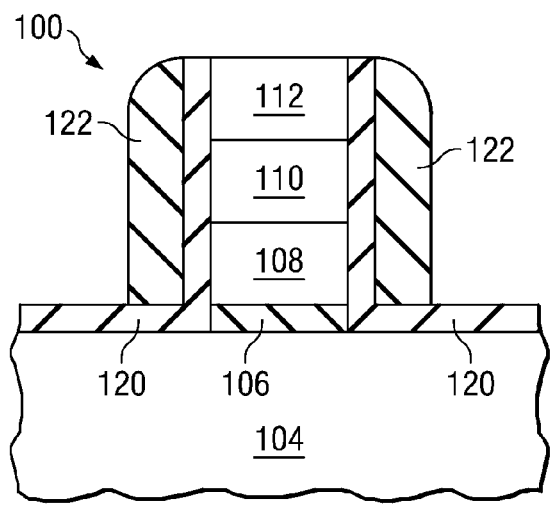
Figure 2D:
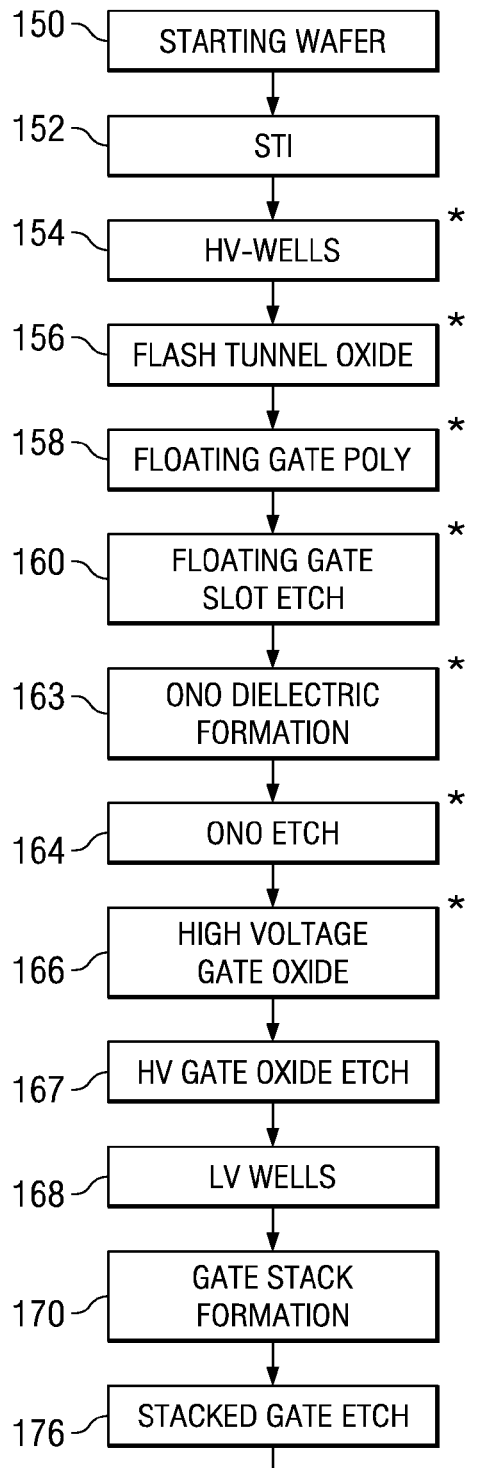
Figure 2D:
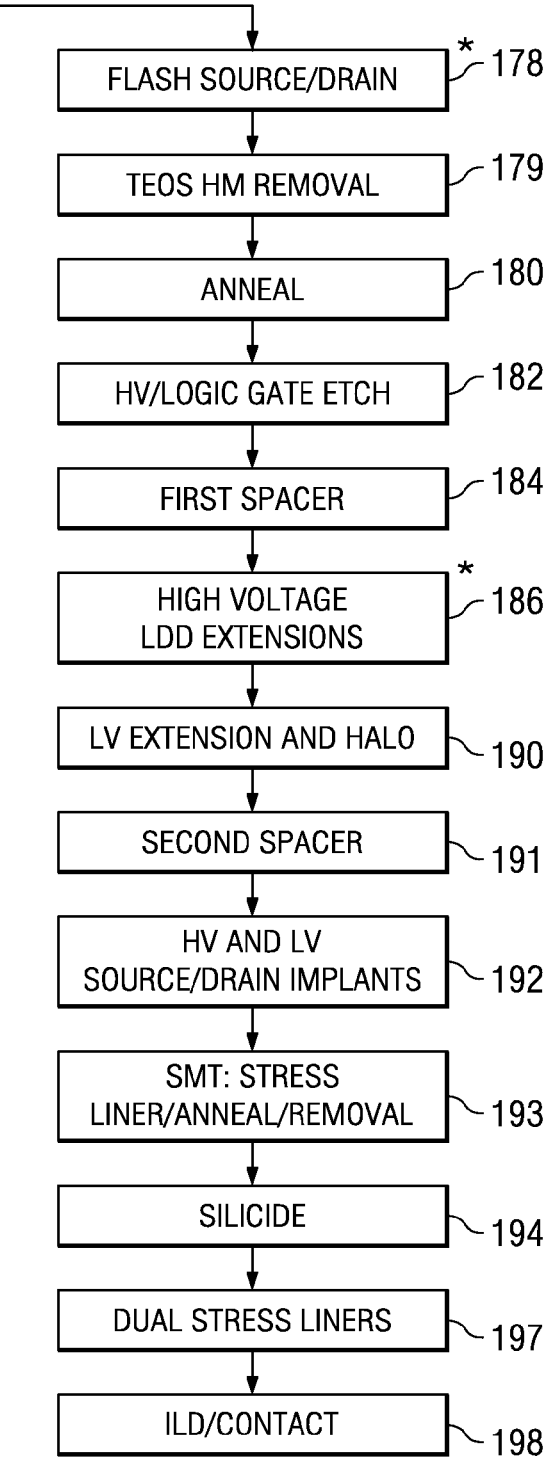

In the second embodiment of the present invention, the cross-sections of which are shown in FIGS. 2a-2c, and described in the process flowchart of FIG. 2d. Unlike the SPT technique of the first embodiment process described herein above, the second embodiment process uses a stress memory technique (SMT) to stress the flash gate stack. In the second embodiment, processing proceeds similarly to the first embodiment up to the standard logic source/drain implant step 192.

Referring to FIG. 2a and the process flow chart of FIG. 2d, semiconductor body 104 is shown on top of which an NVM device is fabricated just prior to SMT step 193. As is described above, a tunnel oxide layer 106, a floating gate 108, an insulating layer 110, and a control gate 112 are formed over the semiconductor body 104. A first spacer 120 is formed on the sidewalls and extension area of the NVM device and on the sidewalls and extension areas of the standard device. A second spacer 122 is formed on the first spacer.

Turning to FIG. 2b, a stress liner 130 is deposited on device 100. As before, a tensile or compressive stressed liner can be deposited. For example a tensile nitride is preferably deposited using PECVD, although alternatively other deposition techniques can be used. The memory device is typically an n-channel device that includes a tensile strained liner.

After the stress liner is deposited on device 100, a spike annealing step is performed wherein the semiconductor body is heated to a temperature between 900° C. and 1200° C., preferably about 1100° C. The spike anneal crystallizes the semiconductor of gate 112 in a manner that causes the strain to remain ("be memorized") within the material. After the annealing step, the stress liner is removed, e.g., using a wet etch as shown in FIG. 2c. The etch stops at the dielectric layer 120. Alternatively, other techniques such as RIE can be used to remove the stress liner.

The source/drain regions (not shown) and the control gate 112 are silicided as described above herein in step 194. Processing continues with the application of dual stress liners in step 197 and ILD and contact formation in step 198 as shown in FIG. 2d and described herein above.

Figure 3A:
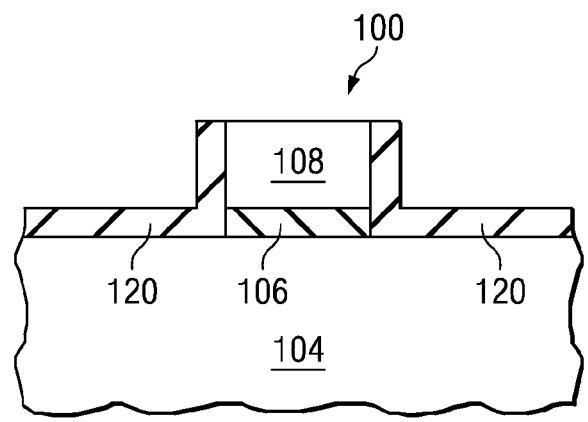
FIGS. 3a-3d provide cross-sectional views and a flowchart of a third embodiment process.
Figure 3B:
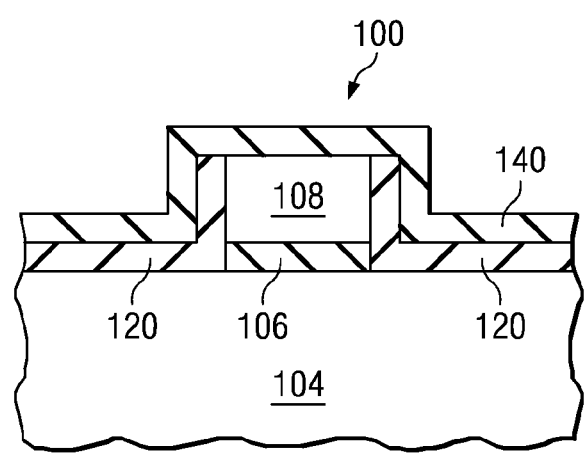
Figure 3C:
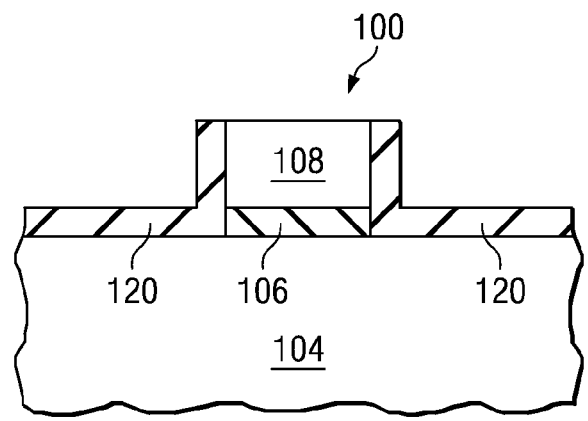
Figure 3D:
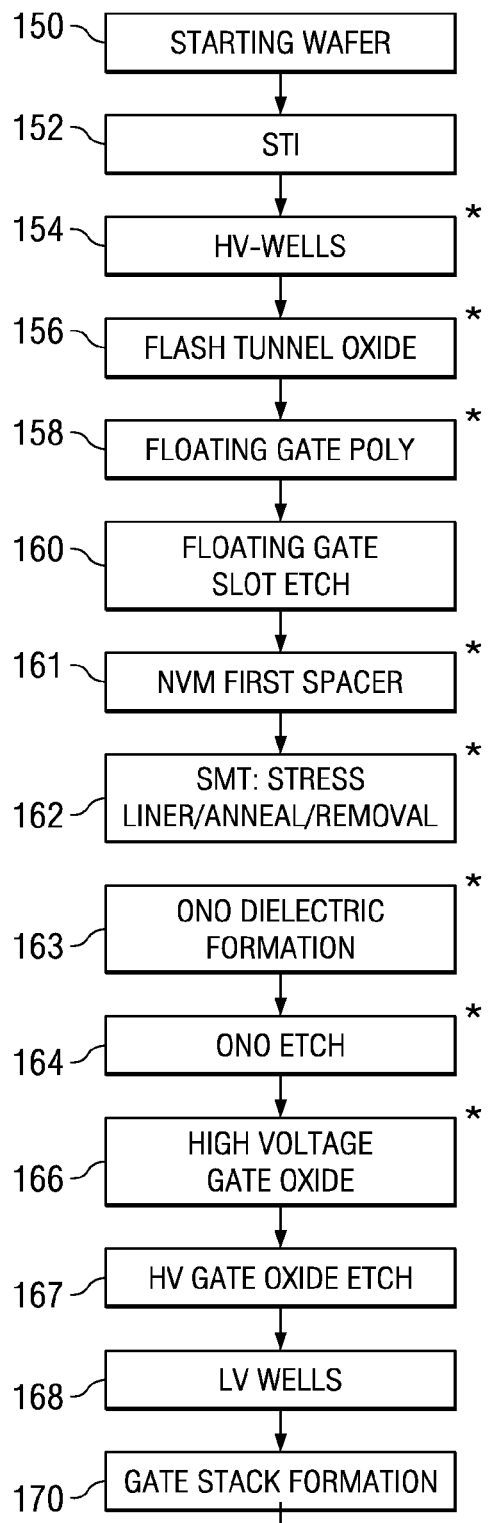
Figure 3D:
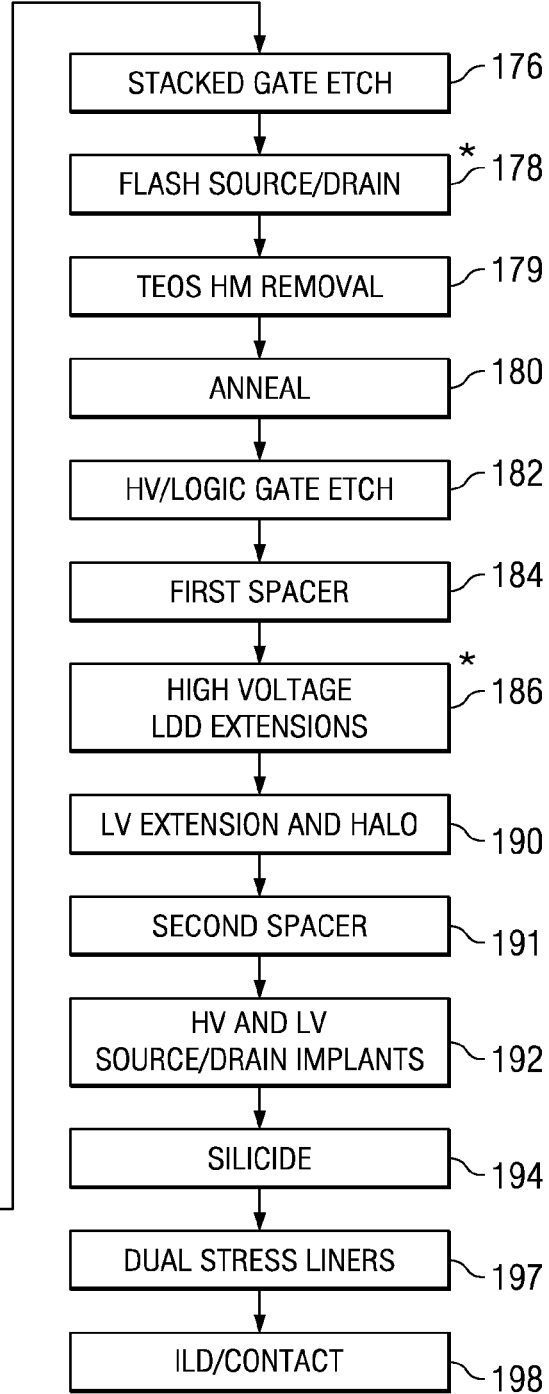

A third embodiment of the present invention is described in the cross-sectional views of FIGS. 3a-3c, and in the process flowchart of FIG. 3d. In this embodiment, an SMT technique is also used. The stress liner is deposited earlier in the process after the floating gate is etched in step 160 and after a first spacer is deposited on the partially fabricated NVM gate stack in step 161.

Referring to FIG. 3a, semiconductor body 104 is shown, on top of which an NVM device is fabricated. As is described herein above, a tunnel oxide layer 106 and a floating gate 108, are formed over the semiconductor body 104. A first spacer 120 is formed on the sidewalls and extension area of the NVM device in step 161 of the process flowchart of FIG. 3d.

Turning to FIG. 3b, a stress liner 140 is deposited on device 100. In the third embodiment of the present invention, where an n-channel NVM transistor is to be formed, the stress liner 140 is typically a tensile stress nitride deposition. The deposition is preferably deposited using PECVD, although alternatively, RTCVD can be used. In other embodiments where p-channel transistors are formed, a compressive stress liner is typically used.

The gate 108 is typically polycrystalline prior to deposition of the stress liner 140. In another embodiment, the gate layer 108 is deposited as amorphous silicon.

After the stress liner is deposited on device 100, a spike annealing step is performed wherein the semiconductor body is heated to a temperature between 900° C. and 1200° C., preferably about 1100° C. The spike anneal causes the stress imparted in the gate 108 (and possibly the exposed semiconductor body 104) to be retained in the crystallized semiconductor. After the annealing step, the stress liner is removed using a wet etch.

Processing continues according to the process flowchart of FIG. 3d and as described herein above beginning with the ONO dielectric formation of step 163.

It will also be readily understood by those skilled in the art that materials and methods may be varied while remaining within the scope of the present invention. It is also appreciated that the present invention provides many applicable inventive concepts other than the specific contexts used to illustrate preferred embodiments. Accordingly, the appended claims are intended to include within their scope such processes, machines, manufacture, compositions of matter, means, methods, or steps.

What is claimed is:

1. A method of making a semiconductor device, the method comprising:
   forming a gate dielectric over a semiconductor body:
   forming a floating gate over the gate dielectric;
   forming an insulating region over the floating gate;
   forming a control gate over the insulating region;
   forming a stress inducing liner over the floating gate:
   annealing a gate material underlying and physically contacting the stress inducing liner, thereby memorizing stress in the gate material; and
   removing the stress inducing liner.

2. The method of claim 1, further comprising amorphizing the control gate prior to forming the stress inducing liner.

3. The method of claim 1, wherein forming the control gate comprises simultaneously forming a gate for a logic transistor.

4. The method of claim 3, further comprising inducing a stress in the gate dielectric and in the logic transistor.

5. The method of claim 1, wherein annealing the gate material comprises performing a spike anneal.

6. The method of claim 1, wherein the stress inducing liner is removed using a wet etch.

7. The method of claim 1, wherein the stress inducing liner comprises a nitride liner.

8. The method of claim 1, wherein the gate dielectric comprises a stressed gate dielectric having an energy gap that is greater than a band gap of a relaxed gate dielectric having a same material as the stressed gate dielectric.

9. The method of claim 4, wherein the logic transistor includes a compressively strained channel.

10. The method of claim 4, wherein the logic transistor includes a tensilely strained channel.

11. The method of claim 1, wherein the gate material is the control gate, and wherein, forming the stress inducing liner, annealing the gate material, and removing the stress inducing liner are performed after forming the control gate.

* * * * *